(12) United States Patent
Hwang et al.

(10) Patent No.: US 9,384,962 B2
(45) Date of Patent: Jul. 5, 2016

(54) OXYGEN TREATMENT OF REPLACEMENT WORK-FUNCTION METALS IN CMOS TRANSISTOR GATES

(75) Inventors: Guang-Yaw Hwang, Tainan (TW);
Chun-Hsien Lin, Tainan (TW);
Hung-Ling Shih, Chiayi County (TW);
Jiunn-Hsiung Liao, Tainan (TW);
Zhi-Cheng Lee, Tainan (TW);
Shao-Hua Hsu, Taoyuan County (TW);
Yi-Wen Chen, Tainan (TW);
Cheng-Guo Chen, Changhua County (TW); Jung-Tsung Tseng, Tainan (TW);
Chien-Ting Lin, Hsinchu (TW);
Tong-Jyun Huang, Tainan (TW);
Jie-Ning Yang, Ping-Tung County (TW); Tsung-Lung Tsai, Tai-Nan (TW);
Po-Jui Liao, Taichung (TW);
Chien-Ming Lai, Tainan (TW);
Ying-Tsung Chen, Kaohsiung (TW);
Cheng-Yu Ma, Tainan (TW); Wen-Han Hung, Kaohsiung (TW); Che-Hua Hsu, Hsinchu County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 447 days.

(21) Appl. No.: 13/082,387

(22) Filed: Apr. 7, 2011

(65) Prior Publication Data
US 2012/0256276 A1 Oct. 11, 2012

(51) Int. Cl.
*H01L 21/28* (2006.01)
*H01L 21/02* (2006.01)

(52) U.S. Cl.
CPC .................. *H01L 21/02148* (2013.01)

(58) Field of Classification Search
USPC .......... 438/585, 587, 590–592; 257/E21.177, 257/E21.204
See application file for complete search history.

(56) References Cited

U.S. PATENT DOCUMENTS

| | | | |
|---|---|---|---|
| 6,066,533 A | 5/2000 | Yu |
| 6,492,217 B1 | 12/2002 | Bai |
| 6,552,377 B1 | 4/2003 | Yu |
| 6,696,345 B2 | 2/2004 | Chau |
| 6,790,719 B1 | 9/2004 | Adetutu |
| 6,794,234 B2 | 9/2004 | Polishchuk |
| 6,902,969 B2 | 6/2005 | Adetutu |
| 6,921,711 B2 | 7/2005 | Cabral, Jr. |
| 7,030,430 B2 | 4/2006 | Doczy |
| 7,074,664 B1 | 7/2006 | White |
| 7,109,079 B2 | 9/2006 | Schaeffer, III |
| 7,126,199 B2 | 10/2006 | Doczy |

(Continued)

OTHER PUBLICATIONS

Po-Jui Liao et al., Title: Semiconductor Device Having Metal Gate and Manufacturing Method Thereof, pending U.S. Appl. No. 13/158,479, filed Jun. 13, 2011.

(Continued)

*Primary Examiner* — Marcos D. Pizarro
(74) *Attorney, Agent, or Firm* — Winston Hsu; Scott Margo

(57) ABSTRACT

A method of manufacturing a metal gate is provided. The method includes providing a substrate. Then, a gate dielectric layer is formed on the substrate. A multi-layered stack structure having a work function metal layer is formed on the gate dielectric layer. An $O_2$ ambience treatment is performed on at least one layer of the multi-layered stack structure. A conductive layer is formed on the multi-layered stack structure.

22 Claims, 11 Drawing Sheets

(56) References Cited

U.S. PATENT DOCUMENTS

| | | |
|---|---|---|
| 7,157,378 B2 | 1/2007 | Brask |
| 7,193,893 B2 | 3/2007 | Forbes |
| 7,208,366 B2 | 4/2007 | Tsai |
| 7,381,619 B2 | 6/2008 | Wang |
| 7,390,709 B2 | 6/2008 | Doczy |
| 7,488,656 B2 | 2/2009 | Cartier |
| 7,785,958 B2 | 8/2010 | Doczy |
| 8,310,012 B2 | 11/2012 | Hwang |
| 8,574,990 B2 | 11/2013 | Liao |
| 2002/0127888 A1 | 9/2002 | Cho |
| 2005/0095763 A1 | 5/2005 | Samavedam |
| 2005/0110098 A1* | 5/2005 | Yoshihara .................... 257/371 |
| 2005/0202659 A1 | 9/2005 | Li |
| 2005/0275035 A1 | 12/2005 | Mathew |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1* | 6/2007 | Bohr ............................ 257/351 |
| 2007/0148838 A1 | 6/2007 | Doris |
| 2007/0210354 A1 | 9/2007 | Nabatame |
| 2007/0262451 A1 | 11/2007 | Rachmady |
| 2008/0076216 A1 | 3/2008 | Pae |
| 2008/0290416 A1* | 11/2008 | Yu et al. ........................ 257/369 |
| 2008/0318371 A1 | 12/2008 | Lin |
| 2009/0057787 A1 | 3/2009 | Matsuki |
| 2009/0166769 A1 | 7/2009 | Metz |
| 2010/0052074 A1 | 3/2010 | Lin |
| 2010/0065926 A1 | 3/2010 | Yeh |
| 2010/0068877 A1* | 3/2010 | Yeh et al. ...................... 438/592 |
| 2010/0081262 A1 | 4/2010 | Lim |
| 2010/0127336 A1* | 5/2010 | Chambers et al. ............ 257/369 |
| 2011/0127590 A1* | 6/2011 | Binder et al. ................. 257/288 |
| 2012/0244669 A1 | 9/2012 | Liao |
| 2012/0264284 A1* | 10/2012 | Wang et al. ................... 438/592 |
| 2012/0313178 A1 | 12/2012 | Liao |

OTHER PUBLICATIONS

Guang-Yaw Hwang et al., Title: Semiconductor Device Having Metal Gate and Manufacturing Method Thereof, pending U.S. Appl. No. 12/759,670, filed Apr. 13, 2010.

* cited by examiner

OXYGEN TREATMENT OF REPLACEMENT WORK-FUNCTION METALS IN CMOS TRANSISTOR GATES

BACKGROUND OF THE INVENTION

1. Field of the Invention

The present invention relates to a metal gate and the fabrication method thereof, and more particularly, to a metal gate with a multi-layered stack structure and the fabrication method thereof, and at least one layer of the multi-layered stack structure includes oxygen.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional poly-silicon gate to be the control electrode that are suitable for use as the high-K gate dielectric layer.

In a complementary metal-oxide semiconductor (CMOS) device, one of the dual work function metal gates is used in an NMOS device and the other one is alternatively used in a PMOS device. It is well-known that compatibility and process control for the dual metal gate are more complicated, meanwhile thickness and composition controls for materials used in the dual metal gate method are more precise. The conventional dual metal gate methods are categorized into gate first processes and gate last processes. In a conventional dual metal gate method applied with the gate first process, the annealing process for forming the source/drain ultra-shallow junction, and the silicide process are performed after forming the metal gate. In the conventional gate last process, a sacrificial gate or a replacement gate is provided and followed by performing processes used to construct a normal MOS transistor. Then, the sacrificial/replacement gate is removed to form a gate trench. Consequently, the gate trench is filled with metals according to the different electrical requirements. However, because of the complicated steps of the gate last processes, the manufacturers are devoted to simplifying the manufacturing process.

In the gate first process or the gate last process, the metal gate of the PMOS or the NMOS may include a plurality of metal layers. The materials of the metal layers always affect the work function of the NMOS or the PMOS, therefore affect the performance of the product. Thus, the manufacturers are searching for new manufacturing method to obtain a MOS with better work function performance.

SUMMARY OF THE INVENTION

The present invention therefore provides a metal gate and its fabrication method. The metal gate includes a multi-layered stack structure and at least one layer of the multi-layered stack structure includes oxygen.

According to one embodiment of the present invention, a method of manufacturing a semiconductor device having a metal gate is provided. The method includes providing a substrate. Then, a gate dielectric layer is formed on the substrate. A multi-layered stack structure having a work function metal layer is formed on the gate dielectric layer. An $O_2$ ambience treatment is performed to at least one layer of the multi-layered stack structure. A conductive layer is formed on the multi-layered stack structure.

According to another embodiment of the present invention, a semiconductor device having a metal gate is provided. The semiconductor device includes a substrate a gate dielectric layer and a multi-layered stack structure. The multi-layered stack structure is disposed on the substrate. At least one layer of the multi-layered stack structure includes a work function metal layer. The concentration of oxygen in the side of one layer of the multi-layered stack structure closer to the gate dielectric layer is less than that in the side of one layer of the multi-layered stack structure opposite to the gate dielectric layer The present invention provides a semiconductor device having a metal gate and it manufacturing method. In conventional arts, the multi-layered stack metal layer may result in poor work function of the metal gate. By using the $O_2$ ambience treatment in the present invention, the work function of the metal gate can be improved and a product with better performance can be obtained.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
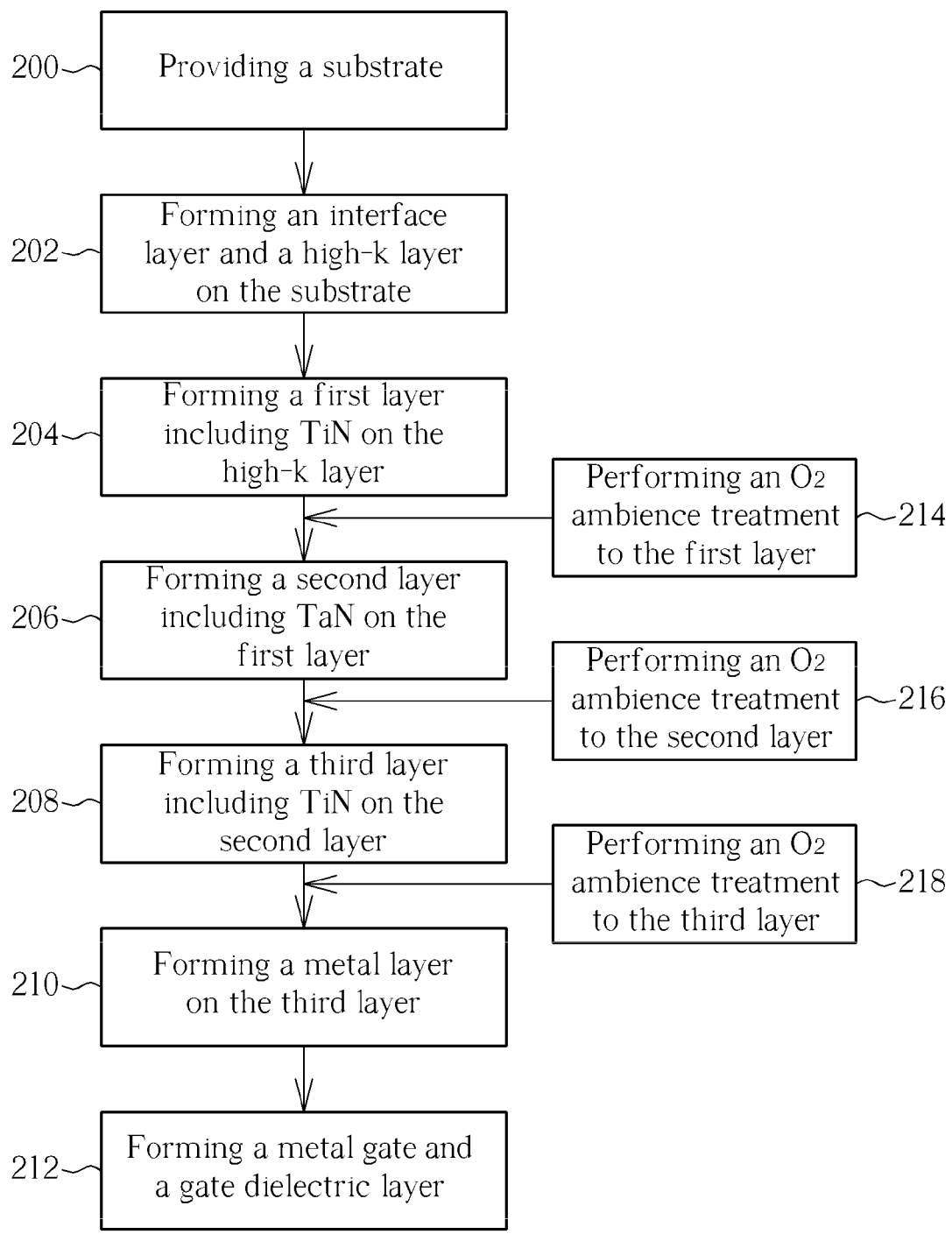
FIG. 1 illustrates schematic diagrams of a first embodiment of the flow chart of the method of fabricating a metal gate in the present invention.
Figure 2:
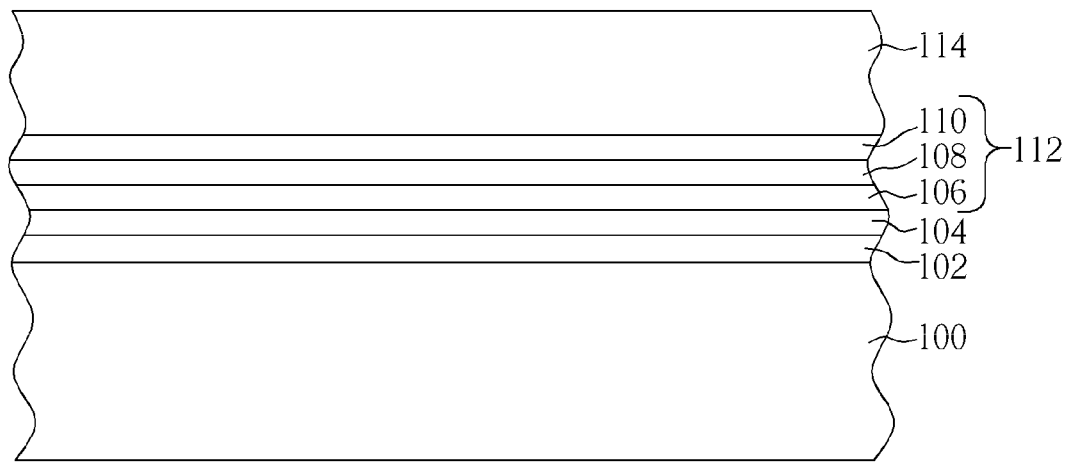
FIG. 2 and FIG. 3 illustrate schematic diagrams of a first embodiment of the method of fabricating a metal gate in the present invention.
Figure 3:
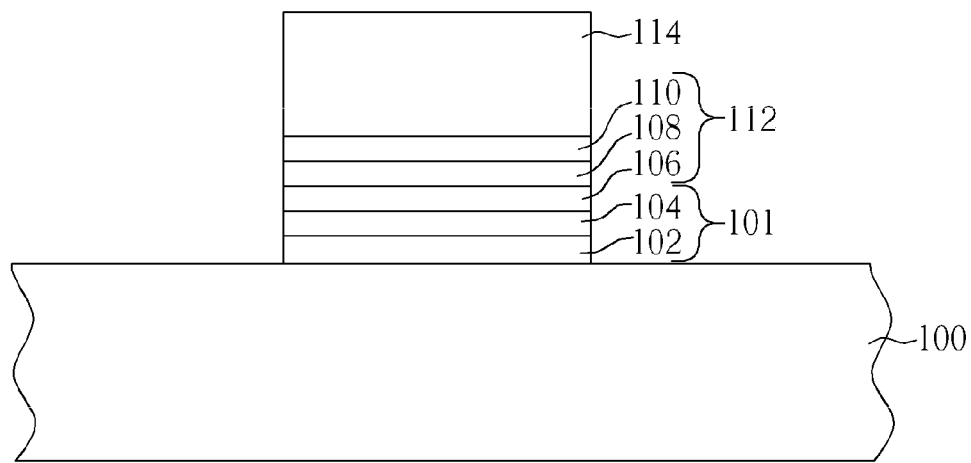

Please refer to FIG. 1 and in conjunction with FIG. 2 and FIG. 3. FIG. 1 illustrates the first embodiment of the flow chart of the method of fabricating a metal gate in the present invention. FIG. 2 and FIG. 3 illustrate schematic diagrams of the first embodiment of the schematic diagram of the method of fabricating a metal gate in the present invention. As shown in FIG. 2, a substrate 100 is provided (step 200). Then an interface layer 102 and a high-k layer 104 are formed on the substrate (step 202). The interface layer 102 may include $SiO_2$ which is formed by an oxidation process for example. The high-k layer 104 may include rare earth metal oxide or lanthanide oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. Next, a multi-layered stack structure 112 is formed on the high-k layer 104 (step 204, step 206, step 208). The multi-layered stack structure 112 includes two or more than two layers of metal/metal nitride. In one embodiment, the multi-layered stack structure 112 includes a first layer 106 including TiN, a second layer 108 including TaN and a third layer 110 including TiN. Subsequently, a conductive layer such as a metal layer 114 which has low resistance is formed on the multi-layered stack structure 114 (step 210).

Figure 20:
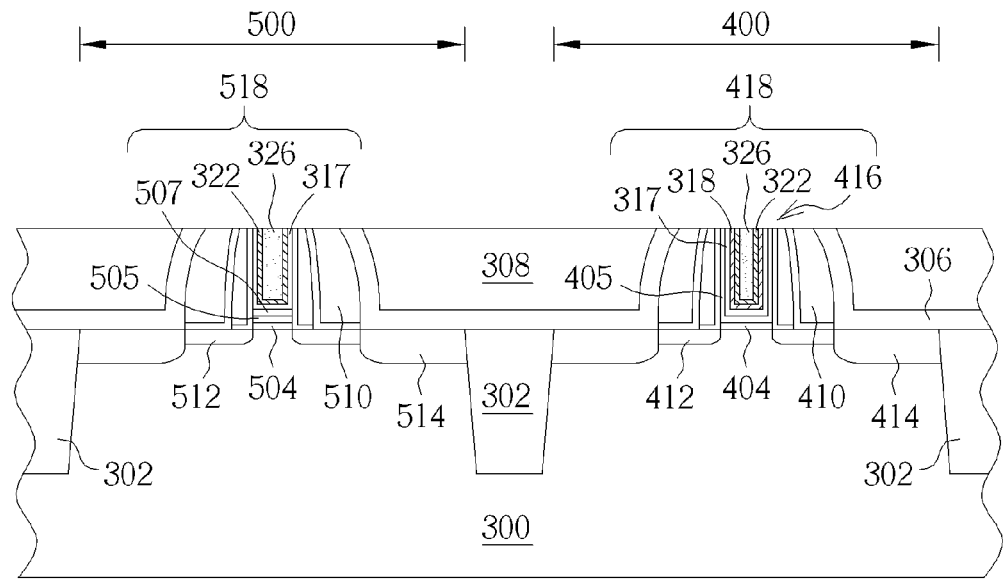
FIG. 20 illustrates schematic diagram of an emobodiment of the method of fabricating a metal gate in the present invention.

FIG. 20 illustrates schematic diagram of an embodiment of the method of fabricating a metal gate in the present invention.

Figure 21:
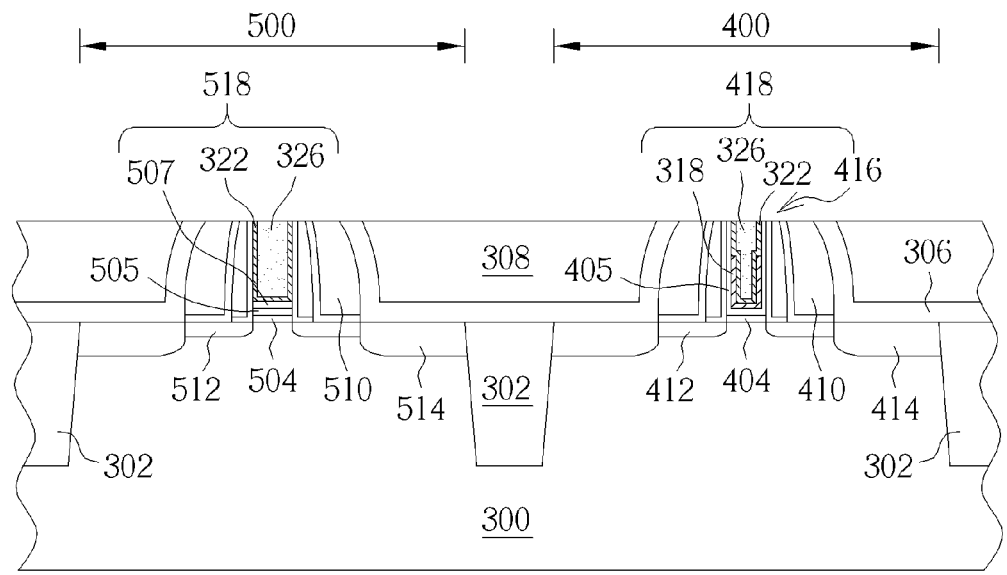
FIG. 21 illustrates schematic diagram of an embodiment of the method of fabricating a metal gate in the present invention.

FIG. 21 illustrates schematic diagram of an embodiment of the method of fabricating a metal gate in the present invention.

As shown in FIG. 3, a photo-etching-process is performed to pattern the metal layer 114, the multi-layered stack structure 112, the high-k layer 104 and the interface layer 102. The metal layer 114 and the multi-layered stack structure 112 together form a metal gate 116, and the high-l layer 104 and the interface layer 102 together form a gate dielectric layer 101 (step 212). Next, a source/drain region 118 is formed. Optionally, a stress formation process, a silidation process or a CESL formation process can be performed so as to complete the formation of the transistor 120.

In order to increase the performance of the transistor 120, one salient feature of the present invention is to provide an $O_2$ ambience treatment to at least one layer of the multi-layered stack structure 112. The $O_2$ ambience treatment may include using solvent having oxygen atom. As shown in FIG. 1, after forming the first layer 106, an $O_2$ ambience treatment can be performed upon the first layer 106 (step 214). After forming the second layer 108, an $O_2$ ambience treatment can be performed upon the second layer 108 (step 216). After forming the third layer 110, an $O_2$ ambience treatment can be performed upon the third layer 110 (step 218). It is understood that the method can be performed by choosing one or two or three of the step 214, step 216 and step 218. The $O_2$ ambience treatment may include an annealing process, a plasma treatment process or a chemical treatment process. In one preferred embodiment, the annealing process includes supplying gas containing $O_2$ under 300° C. to 500° C., preferably 100% $O_2$ gas under 400° C. Plasma treatment process includes using plasma containing $O_2$. Chemical treatment includes using a chemical solvent containing $NH_4OH$, $H_2O_2$ and $H_2O$, such as $SC_1$ solvent. By using the abovementioned $O_2$ ambience treatment, at least one layer of the multi-layered stack structure 112 may include oxygen and the concentration of oxygen in the side closer to the metal layer 114 is greater than that in the side opposite from the metal layer 114.

The above-mentioned embodiment shows the gate first process. It is understood that the present invention can also be applied to the gate last process. Please refer to FIG. 4 to FIG. 10, illustrating schematic diagrams of the second embodiment of the method of fabricating a metal gate in the present invention. First, a substrate 300 is provided, such as a silicon substrate, a silicon-containing substrate or a silicon-on-insulator (SOI) substrate. A plurality of shallow trench isolations (STI) 302 is disposed on the substrate 300. In one embodiment, the STI 302 can provide a stress. According to the areas encompassed by the STI 302, a first active region 400 and a second active region 500, which are insulated from each other, are defined on the substrate 300. Then, a first conductive type transistor 402 and a second conductive type transistor 502 are formed on the substrate 300 respectively in the first active region 400 and the second active region 500. In one preferred embodiment of the present invention, the first conductive type transistor 402 is a P-type transistor, while the second conductive type transistor 502 is an N-type transistor.

Figure 4:
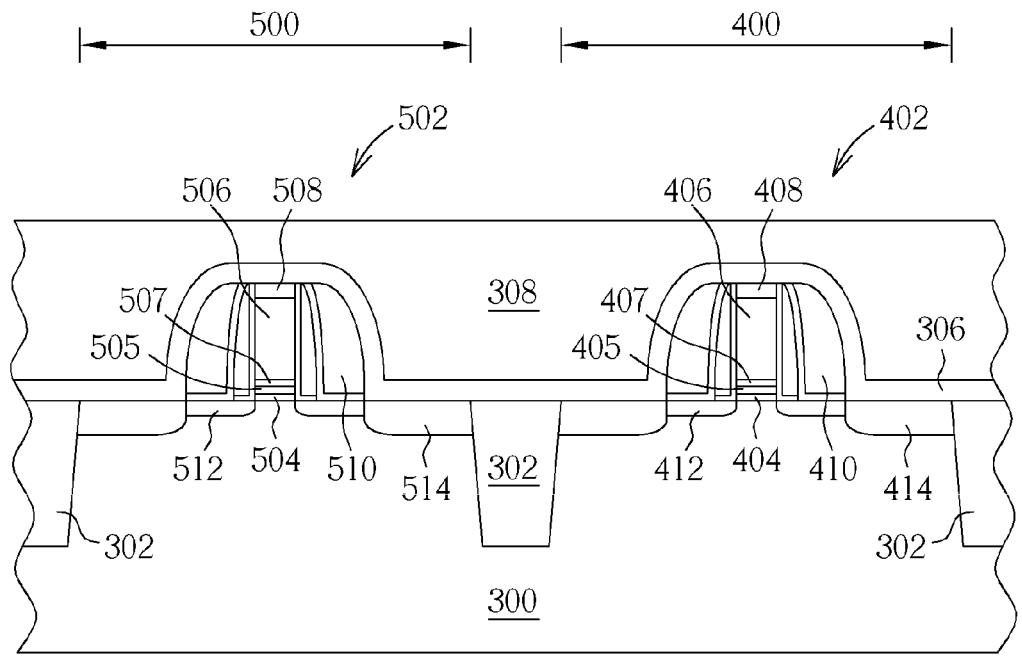
FIG. 4 to FIG. 10 illustrate schematic diagrams of a second embodiment of the method of fabricating a metal gate in the present invention.

As shown in FIG. 4, the first conductive type transistor 402 includes a first interface layer 404, a first high-k layer 405, a first etch stop layer 407, a first sacrificial gate 406, a first capping layer 408, a first spacer 410, a first lightly doped drain (LDD) 412 and a first source/drain 414. In one preferred embodiment of the present invention, the first interface layer 404 can be a $SiO_2$ layer. The high-k gate dielectric layer includes above-mentioned high-k material. The first etch stop layer 407 includes metal/metal nitride, such as TiN. The first sacrificial gate 406 is a poly-silicon gate. In another embodiment, the first sacrificial gate 406 is a multi-layered gate including a poly-silicon layer, an amorphous silicon layer or a germanium layer. In another embodiment, the sacrificial gate 406 may include an inclined sidewall, thereby forming an "up-large-bottom-small" structure. The first capping layer 408 is a SiN layer for example. The first spacer 410 can be a multi-layered structure including high temperature oxide (HTO), SiN, SiO or SiN formed by hexachlorodisilane ($Si_2Cl_6$) (HCD-SiN). In one embodiment, the first spacer 410 can be partially or completely removed to produce a desired stress of the contact etch stop layer (CESL) 306 toward the first conductive type transistor 402 and the second conductive type transistor 502. The first LDD 412 and the first source/drain 414 are formed by appropriate implant doping.

The second conductive type transistor 502 includes a second gate dielectric layer 504, a second sacrifice gate 506, a second capping layer 508, a second spacer 510, a second LDD 512 and a second source/drain 514. The embodiment of each component in the second conductive type transistor 502 is similar to that of the first conductive type transistor 402 and is not described repeatedly. In addition, the first conductive type transistor 402 and the second conductive type transistor 502 can further include other semiconductor structures which are not explicitly shown in FIG. 4, such as a silicide layer, a source/drain having an hexagon (also called sigma Σ) or octagon shaped cross-section which is formed by selective epitaxial growth (SEG), or other protective films. After forming the first conductive type transistor 402 and the second conductive type transistor 502, a contact etch stop layer (CESL) 306 and an inter-layer dielectric (ILD) layer 308 are formed on the substrate 300 to cover the first conductive type transistor 402 and the second conductive type transistor 502. In one embodiment, the CESL 306 can generate a stress to form a selective strain scheme (SSS) wherein a compressing force is applied on the first conductive type electrode 402 and a straining force is applied on the second conductive type electrode 502.

Figure 5:
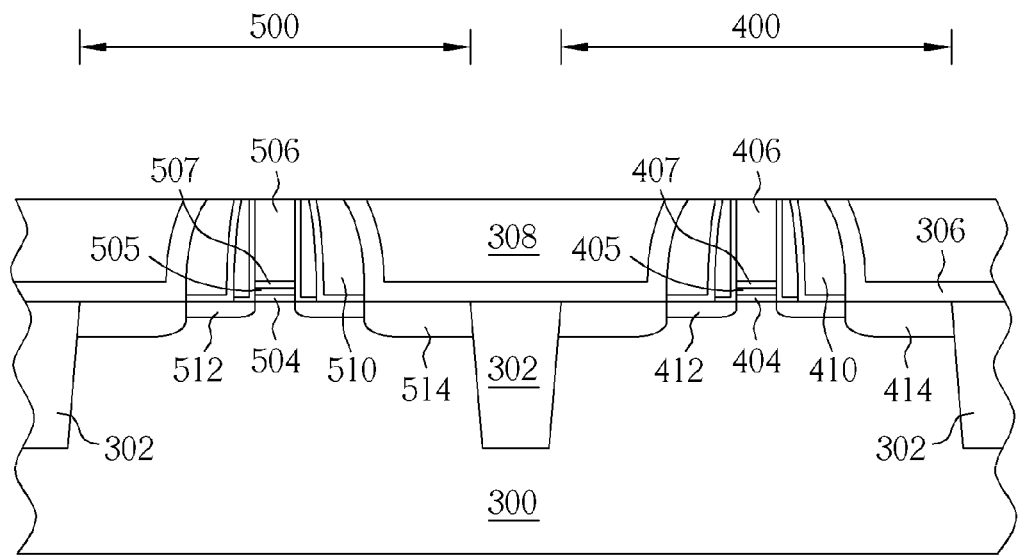

As shown in FIG. 5, a planarization process, such as a chemical mechanical polish (CMP) process or an etching-back process or their combination is performed to remove a part of the ILD layer 308, a part of the CESL 306, a part of the first spacer 410, a part of the second spacer 510, and completely remove the first capping layer 408 and the second capping layer 508, until the top surface of the first sacrificial gate 406 and the second sacrificial gate 506 are exposed.

Figure 6:
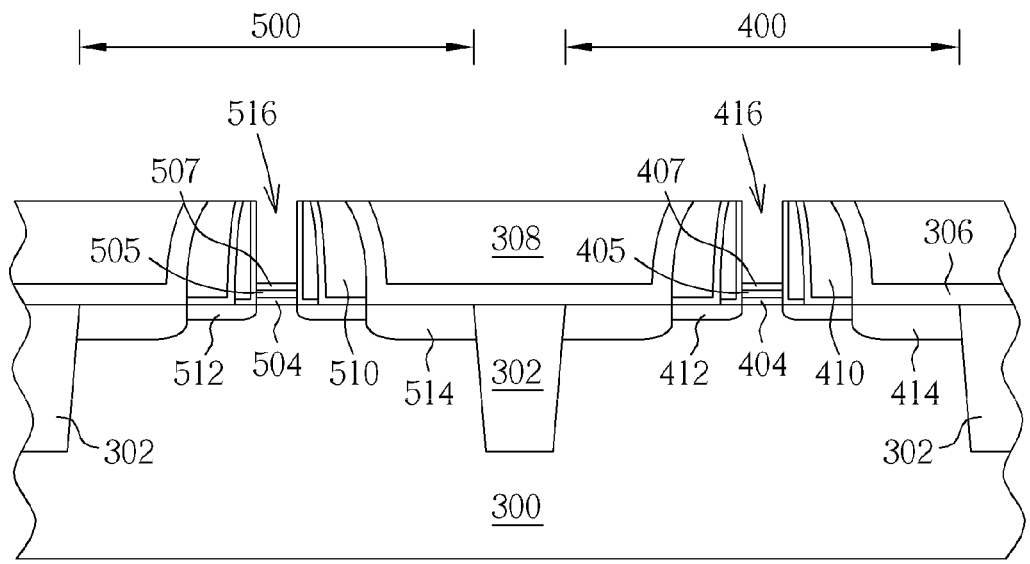

As shown in FIG. 6, a wet etching process is performed to remove the first sacrificial gate 406 and the second sacrificial gate 506 until exposing the first etch stop layer 407 and the second etch stop layer 507. A first trench 416 is formed in the first conductive type transistor 402 and a second trench 516 is formed in the second conductive type transistor 502. Then, an $O_2$ ambience treatment is performed on the exposed first etch stop layer 407 and the exposed second etch stop layer 507, simultaneously or respectively. In another embodiment, the $O_2$ ambience treatment can also be performed when forming the first etch stop layer 407 and the second etch stop layer 507. The $O_2$ ambience treatment may include an annealing process, a plasma treatment process or a chemical treatment process. In one preferred embodiment, the annealing process includes supplying gas containing $O_2$ under 300° C. to 500° C., preferably 100% $O_2$ gas under 400° C. Plasma treatment process includes using plasma containing $O_2$. Chemical treatment includes using a chemical solvent containing $NH_4OH$, $H_2O_2$ and $H_2O$, such as $SC_1$ solvent.

Figure 7:
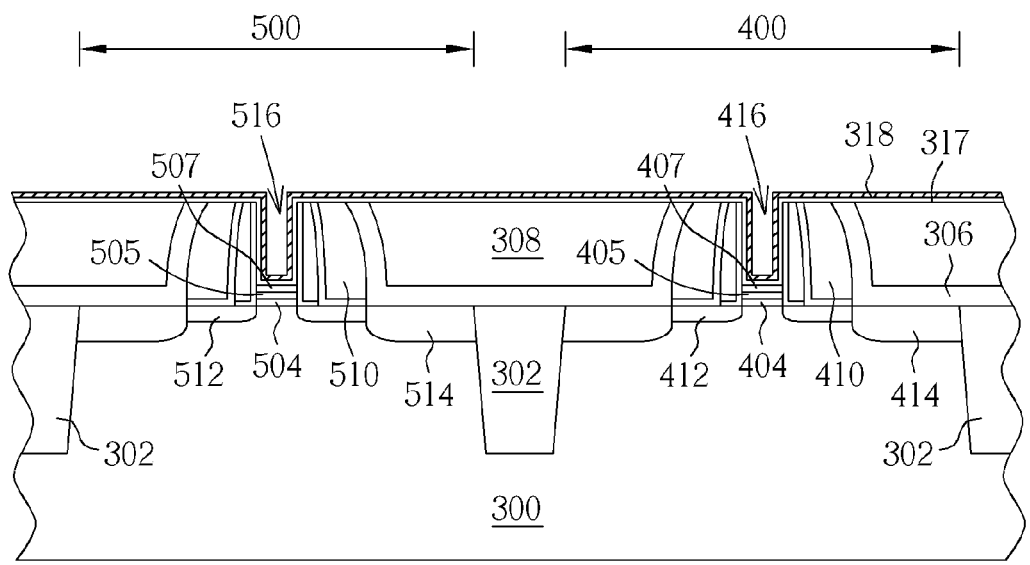

As shown in FIG. 7, a barrier layer 317 is formed on the substrate 300. The barrier layer 317 is formed on the surface of the first trench 416 and the second trench 516 where the first trench 416 and the second trench 516 are not completely filled with the barrier layer 317. The barrier layer 317 includes metal/metal nitride, in one preferred embodiment, the barrier layer 317 in TaN. Next, an $O_2$ ambience treatment is performed to the barrier layer 317. The $O_2$ ambience treatment may include an annealing process, a plasma treatment process or a chemical treatment process. In one preferred embodiment, the annealing process includes supplying gas containing $O_2$ under 300° C. to 500° C., preferably 100% $O_2$ gas under 400° C. Plasma treatment process includes using plasma containing $O_2$. Chemical treatment includes using a chemical solvent containing $NH_4OH$, $H_2O_2$ and $H_2O$, such as $SC_1$ solvent. Next, a P type work function metal layer 318 is formed on the barrier layer 317. In the present embodiment, the P type work function metal layer 318 serves as a work function metal required by a P-type transistor including Ni, Pd, Pt, Be, Ir, Te, Re, Ru, Rh, W, Mo, or WN, RuN, MoN, TiN, TaN, or WC, TaC, TiC, or TiAlN, TaAlN, but should not be limited thereto. The P type work function metal layer 318 has a good etching ratio in respect to the barrier layer 317. Next, an $O_2$ ambience treatment is performed on the P type work function metal layer 318. The $O_2$ ambience treatment may include an annealing process, a plasma treatment process or a chemical treatment process. In one preferred embodiment, the annealing process includes supplying gas containing $O_2$ under 300° C. to 500° C., preferably 100% $O_2$ gas under 400° C. for 1-5 minutes, preferably 2 minutes. Plasma treatment process includes using plasma containing $O_2$. Chemical treatment includes using a chemical solvent containing $NH_4OH$, $H_2O_2$ and $H_2O$, such as $SC_1$ solvent.

Figure 8:
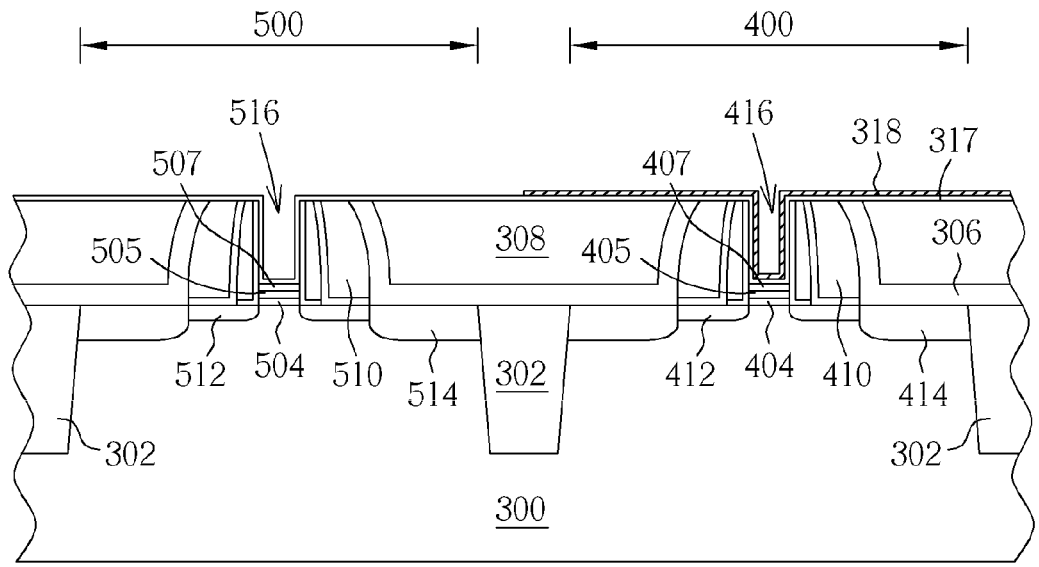
Figure 9:
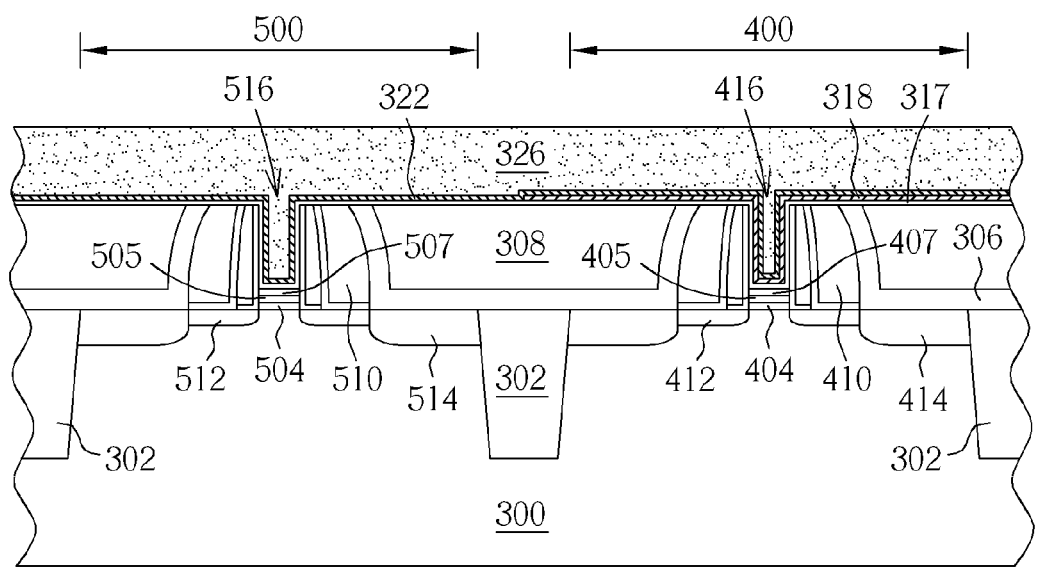

As shown in FIG. 8, the P type work function metal 318 is patterned to remove the P type work function metal 318 in the second active region 500. Since there is good etching selection between the P type work function metal 318 and the barrier layer 317, the barrier layer 317 in the second active region 500 is not removed. As shown in FIG. 9, an N type work function metal layer 322 is formed on the substrate 300. The N type work function metal layer 322 is formed on the surface of barrier layer 317 in the second trench 516 and on the surface of the P type work function metal layer 318 in the first trench 416. However, the first trench 416 and the second trench 516 are not completely filled with the N type work function metal layer 322. In one preferred embodiment of the present invention, the second metal layer 324 serves as a work function metal required by an N-type transistor including titanium aluminides (TiAl), aluminum zirconium (ZrAl), aluminum tungsten (WAl), aluminum tantalum (TaAl) or aluminum hafnium (HfAl), but should not be limited thereto. Lastly, a low resistive metal layer 326 is formed on the substrate 300. The metal layer 326 is formed on the N type work function metal layer 322 and completely fills the first trench 416 and the second trench 516. The metal layer 326 includes Al, Ti, Ta, W, Nb, Mo, TiN, TiC, TaN, Ti/W or Ti/TiN, but is not limited thereto.

Figure 10:
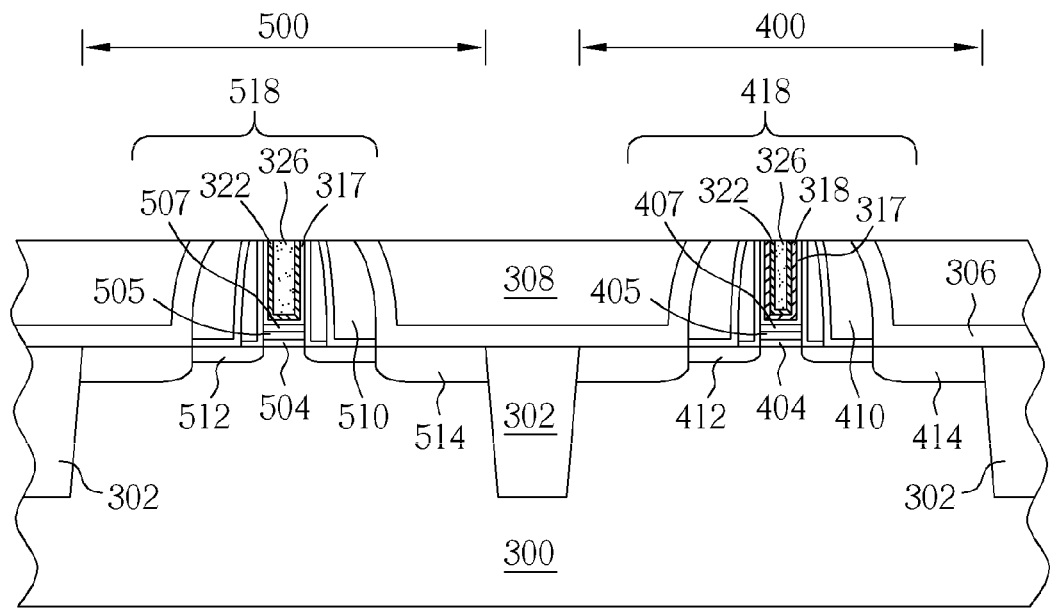

As shown in FIG. 10, a planarization process is performed to simultaneously remove the P type work function metal layer 318, the N type work function metal layer 322, the barrier layer 324 and the metal layer 326 outside the first trench 416 and the second trench 516. Thus, the first etch stop layer 407, the barrier layer 317, the P type work function metal layer 318, the N type work function metal layer 322, and the metal layer 326 in the first trench 416 together form a first metal gate 418 of the first conductive type transistor 402 (P-type transistor), which has a work function substantially between 4.8 eV and 5.2 eV. The second etch stop layer 507, the barrier layer 317, the N type work function metal layer 322 and the metal layer 326 in the second trench 516 together form a second metal gate 518 of the second conductive type transistor 502 (N-type transistor) which has a work function substantially between 3.9 eV and 4.3 eV. Because an $O_2$ ambience treatment is performed to the first etch stop layer 407, the second etch stop layer 507, the barrier layer 317 and the P type work function metal layer 318, the first metal gate 418 and the second metal gate 518 can have a better work function.

After finishing the first metal gate 418 and the second metal gate 518, a contact plug forming process can be carried out, for example, a contact plug having a stress can be formed. In another embodiment, before forming the contact plug, the ILD layer 306 and the CESL 308 can be removed completely. Then, at least one CESL (not shown) can be formed on the substrate 300. By applying a UV or a heat energy, the new CSEL can generate a stress, thereby enhancing the efficiency of the first conductive type transistor 402 and the second conductive type transistor 502, respectively. Another ILD layer (not shown) is then formed and at least a contact plug having appropriate stress can be formed therein.

It should be noted that the above methods present forming the high-k gate dielectric layer at first (namely, the high-K first process). However, those skilled in the art can realize that, in the present invention, it is also available to form the high-k layer 405 after removing the sacrificial gate (namely, the high-K last process). For example, as shown in FIG. 20, a high-K layer 405 can be formed on the surface of the first trench 416 before forming the P type work function metal layer 318. Subsequently, the P type work function metal layer 318 and the metal layer 326 are formed on the high-K gate dielectric layer 405 in the first trench 416. In this embodiment, the high-K gate dielectric layer 405 and the P type work function metal layer 318 will form a U shape in their cross section. In another embodiment, it is also available to form a high-K gate dielectric layer on the surface of the second trench 516 before forming the N type work function metal layer 322. Then, the N type work function metal layer 322 and the metal layer 326 are formed on the high-K gate dielectric layer in the second trench 516. In this embodiment, the high-K gate dielectric layer and the N type work function metal layer 322 will form a U shape in their cross section. In addition, when the invention is performed in the high-k last process, the material of the dielectric layer formed under the sacrifice gate is not limited to high-k material but can include another dielectric material such as $SiO_2$.

Figure 11:
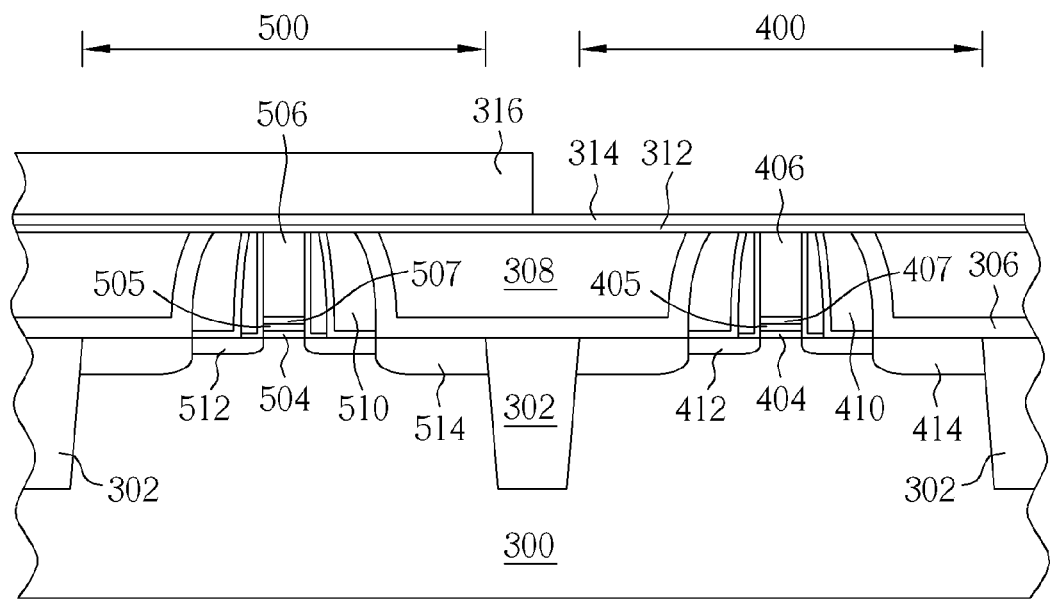
FIG. 11 to FIG. 19 illustrate schematic diagrams of a third embodiment of the method of fabricating a metal gate in the present invention.

Please refer to FIG. 11 to FIG. 19, illustrating a third embodiment of the method of fabricating a metal gate in the present invention. The former steps of the second embodiment are similar to those in FIG. 1 to FIG. 2 of the first embodiment and repeated descriptions are omitted. As shown in FIG. 11, a mask layer 312 and an optional auxiliary layer 314 are formed on the substrate 300. In one preferred embodiment of the present invention, the mask layer 312 is a TiN layer, and the auxiliary layer 314 is a $SiO_2$ layer. The auxiliary layer 314 can provide a better adhesive force toward the first patterned photoresist layer 316 which is formed in the follow-up step. In one embodiment, the thickness of the mask layer 312 is about 50 to 100 A (angstrom), preferably 100 A, and the thickness of the auxiliary layer 314 is about 0 to 50 A, preferably 20 A. However, the thickness is not limited thereto. Then, a first patterned photoresist layer 316 is formed on the substrate 300 to cover at least the second active region 500.

Figure 12:
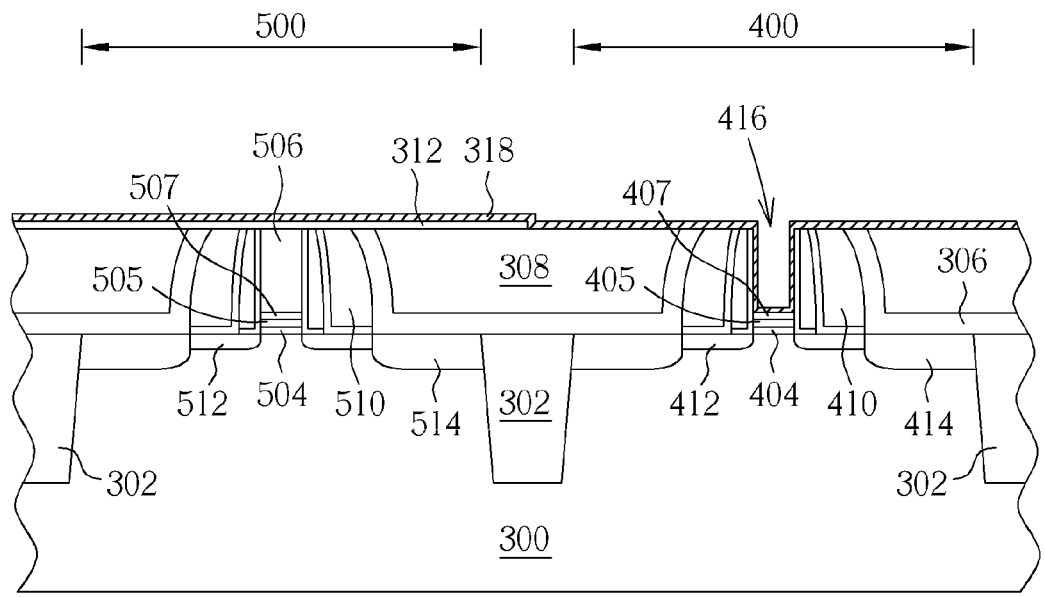

As shown in FIG. 12, by using the first patterned photoresist layer 316 as a mask, a portion of the mask layer 312, the auxiliary layer 314 and the first sacrificial gate 406 not covered by the first patterned photoresist layer 316 are removed, thereby forming a first trench 416. The second sacrificial gate 506 of the second conductive type transistor 502 is not removed since it is covered by the mask layer 312. Then, an $O_2$ ambience treatment is performed to the first etch stop layer 407. The $O_2$ ambience treatment may include an annealing process, a plasma treatment process or a chemical treatment process. In one preferred embodiment, the annealing process includes supplying gas containing $O_2$ under 300° C. to 500° C., preferably 100% $O_2$ gas under 400° C. Plasma treatment processes include using plasma containing $O_2$. Chemical treatment includes using a chemical solvent containing $NH_4OH$, $H_2O_2$ and $H_2O$, such as $SC_1$ solvent. Then, a P type work function metal layer 318 is formed on the substrate 300. The P type work function metal layer 318 is formed on the surface of the first trench 416. However, the first trench 416 is not completely filled with the P type work function metal layer 318. In the present embodiment, the P type work function metal layer 318 serves as a work function metal required by a P-type transistor including Ni, Pd, Pt, Be, Ir, Te, Re, Ru, Rh, W, Mo, or WN, RuN, MoN, TiN, TaN, or WC, TaC, TiC, or TiAlN, TaAlN, but should not be limited thereto. The P type work function metal layer 318 has a good etching ratio in respect to the barrier layer 317. Next, an $O_2$ ambience treatment is performed to the P type work function metal layer 318. The $O_2$ ambience treatment may include an annealing process, a plasma treatment process or a chemical treatment process. In one preferred embodiment, the annealing process includes supplying gas containing $O_2$ under 300° C. to 500° C., preferably 100% $O_2$ gas under 400° C., for 1-5 minutes, preferably 2 minutes. Plasma treatment process includes using plasma containing $O_2$. Chemical treatment includes using a chemical solvent containing $NH_4OH$, $H_2O_2$ and $H_2O$, such as $SC_1$ solvent.

Figure 13:
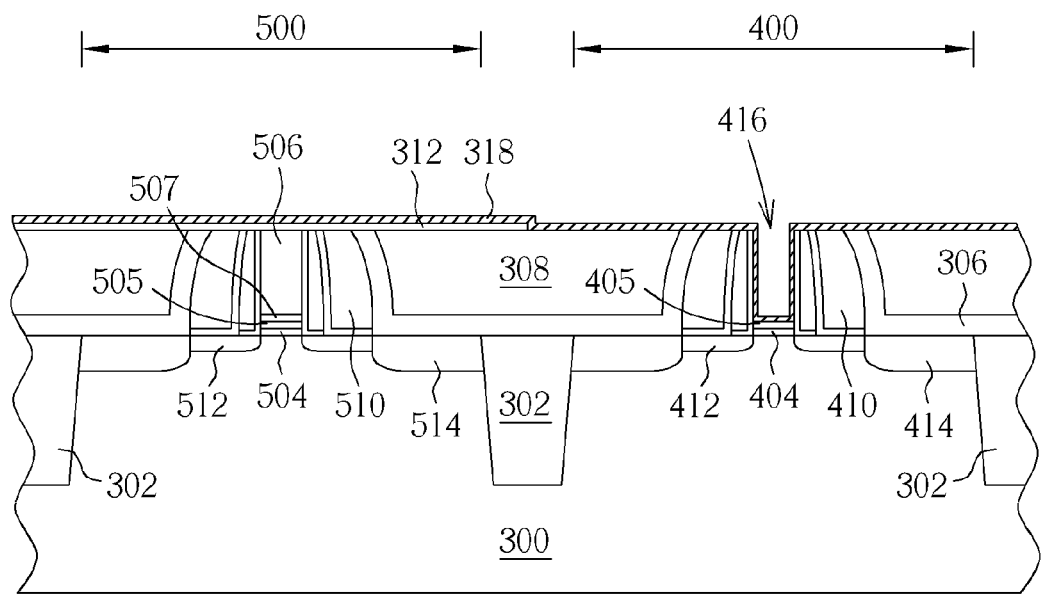

In another embodiment of the present invention, the first etch stop layer 407 can be removed. Please refer to FIG. 13, illustrating another embodiment of the method of fabricating the metal gate in the present invention. As shown in FIG. 13, the first etch stop layer 407 can be removed and then the P type work function metal layer 318 is formed. In this embodiment, the P type work function metal layer 318 can directly contact the first high-k layer 405.

Figure 14:
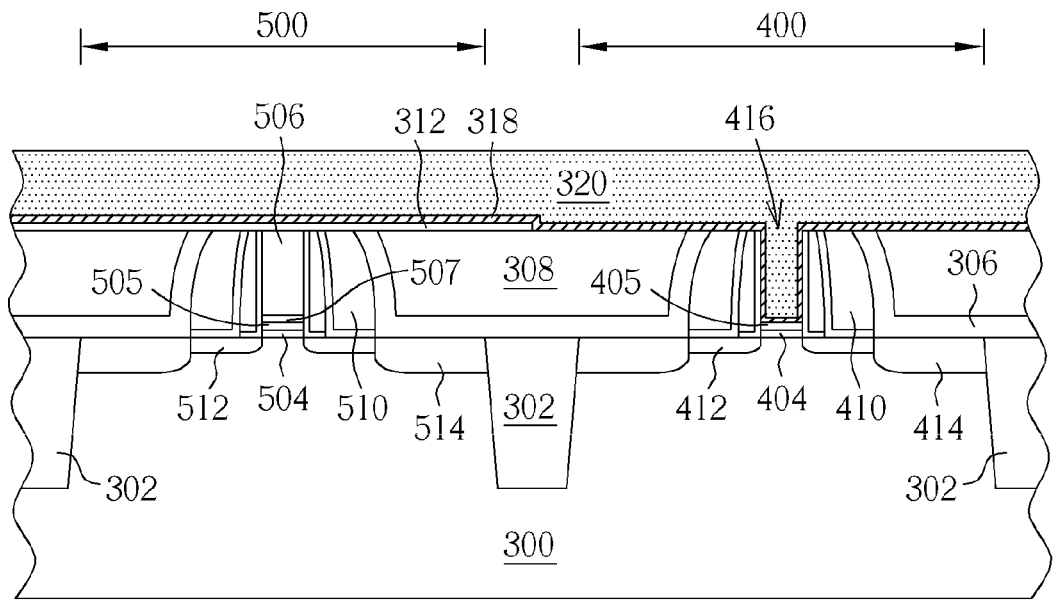
Figure 15:
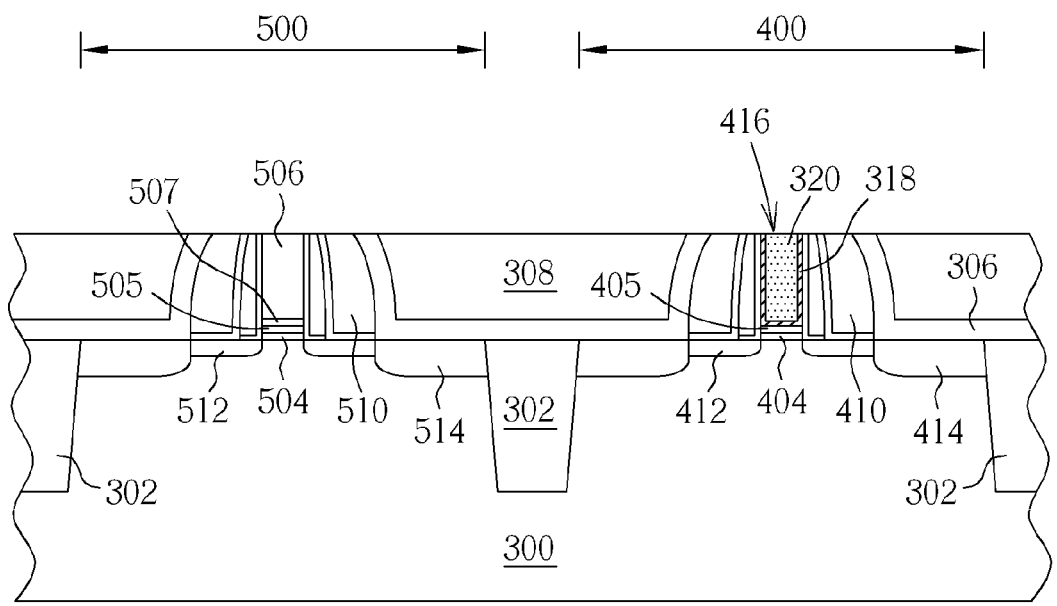
Figure 16:
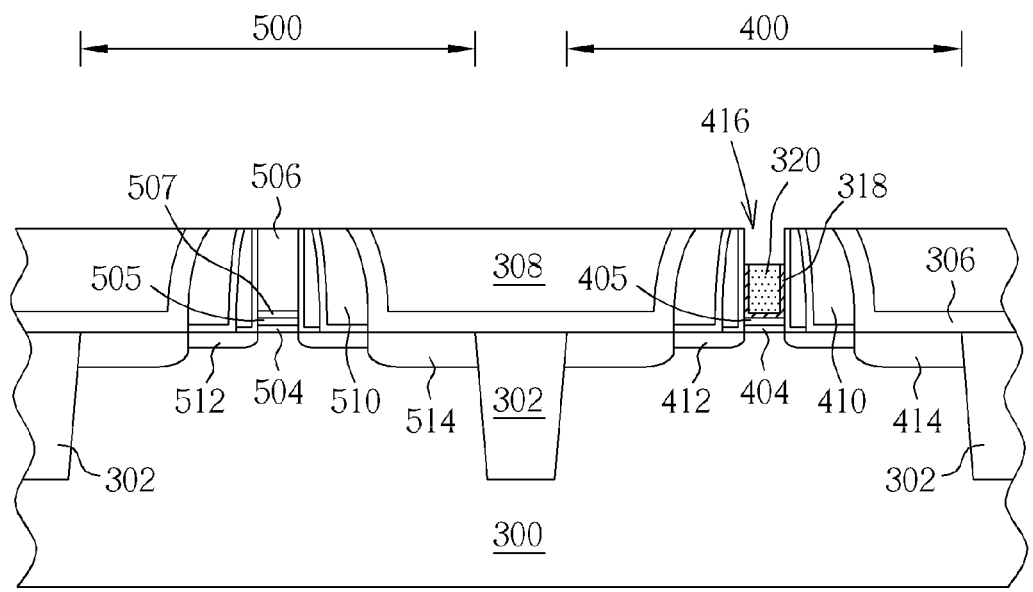
Figure 17:
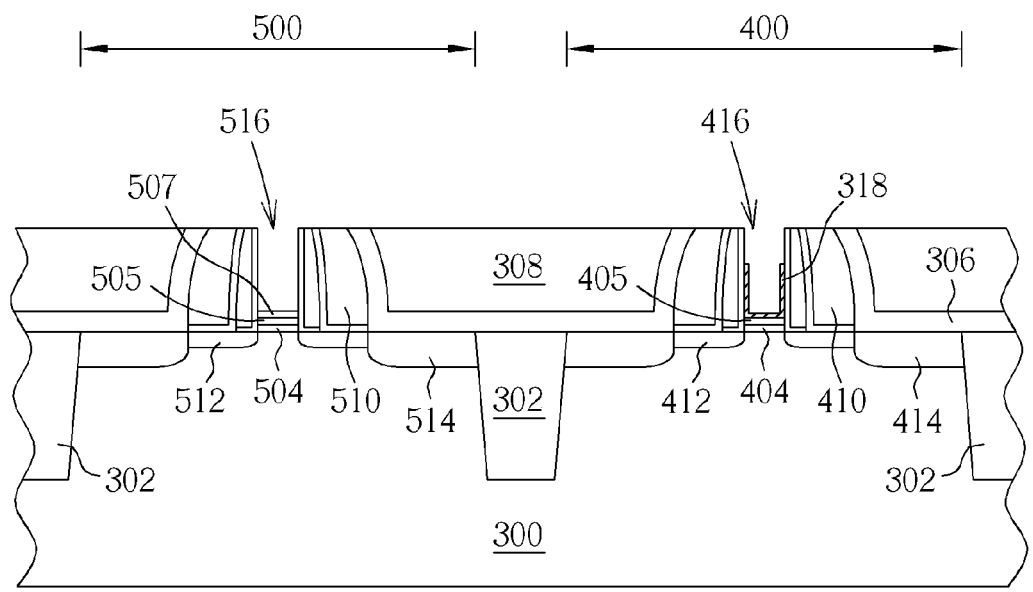
Figure 18:
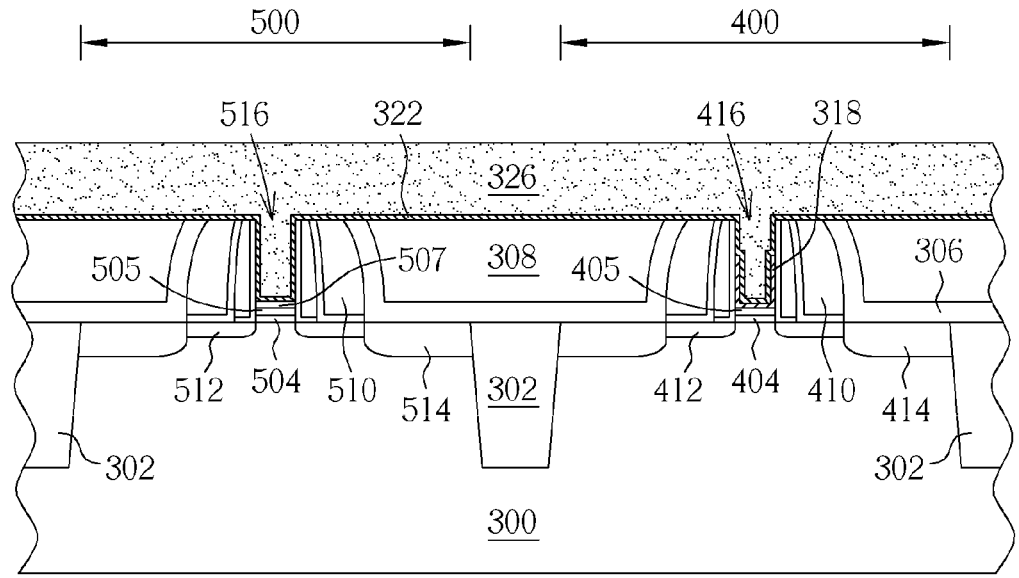

As shown in FIG. 14, an organic layer 320 is formed on the substrate 300. The organic layer 320 at least fills into the first trench 416. In one embodiment, the organic layer 320 may include spin-on glass (SOG), bottom anti-reflective coating (BARC layer), or photoresist layer. As shown in FIG. 15, by using a patterning process or an etching process, the organic layer 320 outside the first trench 416 is removed. As shown in FIG. 16, another etching process is performed to remove a part of the P type work function metal layer 318 and a part of the organic layer 320 in the first trench 416. The remained P type work function metal layer 318 in the first trench therefore forms a U type feature in a cross-section and the most top portion of the U type feature is lower than the opening of the first trench 416. That is, the opening of the first trench 416 is not covered by the P type work function metal layer 318. As shown in FIG. 17, the organic layer 320 in the first trench 416 is removed. In one embodiment, the process of removing the organic layer 320 includes using a plasma containing $O_2/H_2/N_2$, and the concentration of $O_2$ is less than 10%. After removing the organic layer 320, the process can be continued to further provide the treatment upon the P type work function metal layer 318.

As shown in FIG. 11, the second sacrificial gate 506 is removed by using a dry etching process and/or a wet etching process, thereby forming a second trench 516 in the second conductive type transistor 502. Subsequently, an N type work function metal layer 322 is formed on the substrate 300. The N type work function metal layer 322 is formed on the surface of the second trench 516 and on the surface of the P type work function metal layer 318 in the first trench 416. However, the first trench 416 and the second trench 516 are not completely filled with the N type work function metal layer 322. In one preferred embodiment of the present invention, the second metal layer 324 serves as a work function metal required by an N-type transistor including titanium aluminides (TiAl), aluminum zirconium (ZrAl), aluminum tungsten (WAl), aluminum tantalum (TaAl) or aluminum hafnium (HfAl), but should not be limited thereto. Lastly, a low resistive metal layer 326 is formed on the substrate 300. The metal layer 326 is formed on the N type work function metal layer 322 (if the barrier layer 324 is utilized, the metal layer 326 is formed on the barrier layer 324) and completely fills the first trench 416 and the second trench 516. The metal layer 326 includes Al, Ti, Ta, W, Nb, Mo, TiN, TiC, TaN, Ti/W or Ti/TiN, but is not limited thereto.

Figure 19:
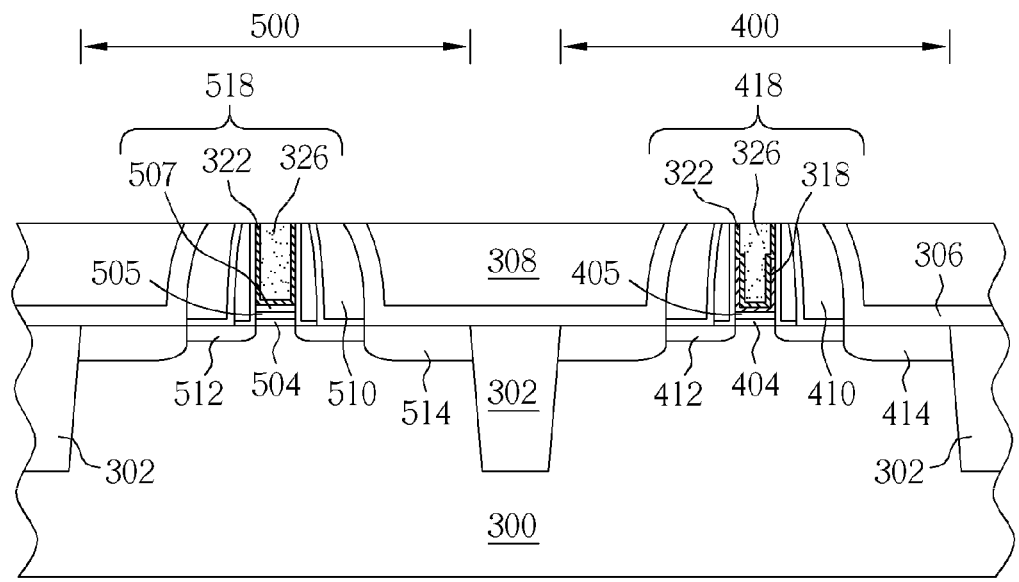

As shown in FIG. 19, a planarization process is performed to simultaneously remove the P type work function metal layer 318, the N type work function metal layer 322 and the metal layer 326 outside the first trench 416 and the second trench 516. Thus, the P type work function metal layer 318, the N type work function metal layer 322, and the metal layer 326 in the first trench 416 together form a first metal gate 418 of the first conductive type transistor 402 (P-type transistor), which has a work function substantially between 4.8 eV and 5.2 eV. The second etch stop layer 507, the N type work function metal layer 322 and the metal layer 326 in the second trench 516 together form a second metal gate 518 of the second conductive type transistor 502 (N-type transistor) which has a work function substantially between 3.9 eV and 4.3 eV. Because an $O_2$ ambience treatment is performed to the first etch stop layer 407, the second etch stop layer 507, the barrier layer 317 and the P type work function metal layer 318, the first metal gate 418 and the second metal gate 518 can have better work functions. Besides, in one embodiment, the P type work function metal layer 318 around the opening of the first trench 416 is removed, so the metal layer 324 can have better gap filling ability.

After finishing the first metal gate 418 and the second metal gate 518, a contact plug forming process can be carried out, for example, a contact plug having a stress can be formed. In another embodiment, before forming the contact plug, the ILD layer 306 and the CESL 308 can be removed completely. Then, at least one CESL (not shown) can be formed on the substrate 300. By applying a UV or a heat energy, the new CSEL can generate a stress, thereby enhancing the efficiency of the first conductive type transistor 402 and the second conductive type transistor 502, respectively. Another ILD layer (not shown) is then formed and at least a contact plug having appropriate stress can be formed therein.

It should be noted that the above methods present forming the high-k gate dielectric layer at first (namely, the high-K first process). However, those skilled in the art can realize that, in the present invention, it is also available to form the high-k layer 405 after removing the sacrificial gate (namely, the high-K last process). For example, as shown in FIG. 21, a high-K layer 405 can be formed on the surface of the first trench 416 before forming the P type work function metal layer 318. Subsequently, the P type work function metal layer 318 and the metal layer 326 are formed on the high-K gate dielectric layer 405 in the first trench 416. In this embodiment, the high-K gate dielectric layer 405 and the P type work function metal layer 318 will form a U shape in their cross section. In another embodiment, it is also available to form a high-K gate dielectric layer on the surface of the second trench 516 before forming the N type work function metal layer 322. Then, the N type work function metal layer 322 and the metal layer 326 are formed on the high-K gate dielectric layer in the second trench 516. In this embodiment, the high-K gate dielectric layer and the N type work function metal layer 322 will form a U shape in their cross section. In addition, when the invention is performed in the high-k last process, the material of the dielectric layer formed under the sacrifice gate is not limited to high-k material but can include another dielectric material such as $SiO_2$.

In summary, the present invention provides a metal gate and its manufacturing method. In conventional arts, the multi-layered stack metal layer may result in poor work function of the metal gate. According to the $O_2$ ambience treatment in the present invention, the work function of the metal gate can be improved and a product with better performance can be obtained.

Those skilled in the art will readily observe that numerous modifications and alterations of the device and method may be made while retaining the teachings of the invention.

What is claimed is:

1. A method of fabricating a semiconductor device having metal gates, comprising:
   providing a substrate defined with a first active region and a second active region;
   forming a gate dielectric layer on the substrate;
   forming a work function metal layer on the gate dielectric layer;
   performing an $O_2$ ambience treatment on the work function metal layer;
   completely removing the work function metal layer from the second active region after the $O_2$ ambience treatment; and
   forming a metal layer on the work function metal layer.

2. The method according to claim 1, wherein a dielectric constant of the gate dielectric layer is substantially greater than 4, and the gate dielectric layer comprises hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST).

3. The method according to claim 1, wherein the metal layer is Al, Ti, Ta, W, Nb, Mo, TiN, TiC, TaN, Ti/W or Ti/TiN.

4. The method according to claim 1, wherein the first active region is PMOS region and the second active region is NMOS region.

5. The method according to claim 1, wherein the work function metal layer covers an etch stop layer and a barrier layer.

6. The method according to claim 5, wherein the etch stop layer comprises TiN, the barrier layer comprises TaN and the work function metal layer comprises TiN.

7. The method according to claim 5, wherein the work function metal layer comprises a plurality of metal layers and the work function metal layer comprises TiAl, TaC, WC, TiN, TiC, TaN, TiAlN or their combination.

8. The method according to claim 1, wherein the $O_2$ ambience treatment comprises an annealing process, a plasma treatment process or a chemical treatment process.

9. The method of fabricating a semiconductor device having a metal gate according to claim 8, wherein the plasma treatment process comprises using a plasma gas comprising oxygen.

10. The method of fabricating a semiconductor device having a metal gate according to claim 8, wherein the chemical treatment process comprises using a solvent comprising $NH_4OH$, $H_2O_2$ and $H_2O$.

11. The method according to claim 1, before forming a work function metal layer, further comprising:
    forming an interlayer dielectric layer on the substrate; and
    forming two gate trenches in the interlayer dielectric layer respectively within the first active region and the second active region.

12. The method according to claim 11, wherein the work function metal layer is conformally formed on the sidewalls of the gate trenches.

13. The method according to claim 11, wherein the work function metal layer is completely removed from the gate trench within the second active region.

14. The method of fabricating a semiconductor device having a metal gate according to claim 1, further comprising forming an interlayer dielectric layer on the substrate, forming two gate trenches in the interlayer dielectric layer respectively within the first active region and the second active region.

15. The method according to claim 14, wherein the gate dielectric layer is formed at the bottom of the gate trenches.

16. The method according to claim 14, wherein-the gate dielectric layer is formed in the gate trenches and the gate dielectric layer has a U-shaped structure.

17. The method according to claim 14, wherein a part of the sidewall of the gate trenches are not covered by the conductive layer and/or the gate dielectric layer.

18. The method according to claim 14, wherein the gate dielectric layer is formed first and then the gate trenches are formed.

19. The method according to claim 14, wherein the gate trenches are formed first and then the gate dielectric layer is formed.

20. The method of fabricating a semiconductor device having a metal gate according to claim 19, further comprising:
   forming a filling layer on the substrate to fill into the gate trench;
   removing a part of one layer of the multi-layered stack structure such that the layer of the multi-layered stack structure comprises an U shape in a cross section; and
   completely removing the filling layer in the gate trench.

21. The method of fabricating a semiconductor device having a metal gate according to claim 20, wherein when removing the filling layer in the gate trench, the $O_2$ ambience treatment is performed simultaneously.

22. The method of fabricating a semiconductor device having a metal gate according to claim 21, wherein the $O_2$ ambience treatment comprises using a plasma gas comprising $O_2$, $N_2$ and $H_2$, wherein the weight concentration of the $O_2$ is substantially less than 10%.

* * * * *